United States Patent [19]
Yang et al.

[11] Patent Number: 5,045,722
[45] Date of Patent: Sep. 3, 1991

[54] OUTPUT BUFFER PRECONDITIONING CIRCUIT

[75] Inventors: Mann-Lu Yang, Cupertino; Sinan Doluca, Mountain View, both of Calif.

[73] Assignee: Advanced Micro Devices, Inc., Sunnyvale, Calif.

[21] Appl. No.: 436,206

[22] Filed: Nov. 14, 1989

[51] Int. Cl.$^5$ .................... H03K 19/01; H03K 17/10
[52] U.S. Cl. .................................. 307/443; 307/448; 307/360; 307/451
[58] Field of Search ............... 307/448, 443, 451, 359, 307/360

[56] References Cited

U.S. PATENT DOCUMENTS

| | | | |
|---|---|---|---|
| 4,574,273 | 3/1986 | Atsumi et al. | 307/475 |
| 4,682,054 | 7/1987 | McLaughlin | 307/446 |
| 4,825,101 | 4/1989 | Walters, Jr. | 307/270 |
| 4,902,914 | 2/1990 | Masuoka | 307/446 |

*Primary Examiner*—David Hudspeth
*Assistant Examiner*—Andrew Sanders
*Attorney, Agent, or Firm*—William J. Benman, Jr.

[57] ABSTRACT

A preconditioning circuit for use with an output buffer. The invention includes circuitry for detecting the output level of the buffer and for increasing the output level of the buffer when the output thereof is below a predetermined level or decreasing the output level of the buffer when the output thereof is above a predetermined level.

19 Claims, 4 Drawing Sheets

OUTPUT BUFFER PRECONDITIONING CIRCUIT

BACKGROUND OF THE INVENTION

1. Field of the Invention

The present invention relates to output buffers. More specifically, the present invention relates to techniques for improving the operation of output buffers.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Output buffers are well known in the art. Output buffers serve to drive loads on memories, logic circuits, output pads and interfaces between internal circuits and output busses. Output buffers are particularly useful in driving heavy capacitive loads. For this purpose, heavy capacitive loads are loads in excess of 30 picofarads.

Conventional buffers are implemented in CMOS technology and are designed to drive the load from its lowest level to its highest level (rail-to-rail). In the case of the capacitive load, this involves a full level charging and discharging of the load between the highest and lowest voltage levels thereof. This causes voltage spikes in the output data and power rails. Such noise affects DC level detection and causes errors and circuit malfunction.

In addition, the requirement that the buffer fully charge and discharge the load significantly slows the operation of the system.

Thus, there is a need in the art to improve the performance of output buffers used to drive capacitive loads.

SUMMARY OF THE INVENTION

The need in the art is addressed by the preconditioning circuit of the present invention. The invention is adapted for use with a buffer and includes circuitry for detecting the output level of the buffer and for increasing the output level of the buffer when the output thereof is below a predetermined low detection threshold or decreasing the output level of the buffer when the output thereof is above a predetermined high detection.

In a specific embodiment, the circuitry for detecting the output level of the buffer includes an output low level detector having first and second NAND gates arranged in a cascaded configuration, the output of the first NAND gate being a first input to the second NAND gate. A first input of the first NAND gate is connected to a source of an enable signal for the preconditioning circuit. A second input of the first NAND gate is connected to the output of the buffer. A second input of the second NAND gate is connected to the source of an enable signal for the preconditioning circuit. The output of the second NAND gate is connected to the input of pullup means for increasing the output level of the buffer. The pullup means is a p-type transistor having a first terminal connected to a source of voltage supply and a second terminal connected to the output of the buffer.

The circuitry for detecting the output level of the buffer further includes an output high level detector. The output high level detector includes a third NAND gate and an inverter arranged in a cascaded configuration with the output of the third NAND gate being input to the inverter. A first input of the third NAND gate is connected to the source of an enable signal for the preconditioning circuit. A second input of the third NAND gate is connected to the output of the buffer. The output of the inverter is connected to the input of pulldown means for reducing the output level of the buffer. The pulldown means is an n-type transistor having a first terminal connected to the output of the buffer and a second terminal connected to a source of a second potential.

DESCRIPTION OF THE INVENTION

Figure 1:
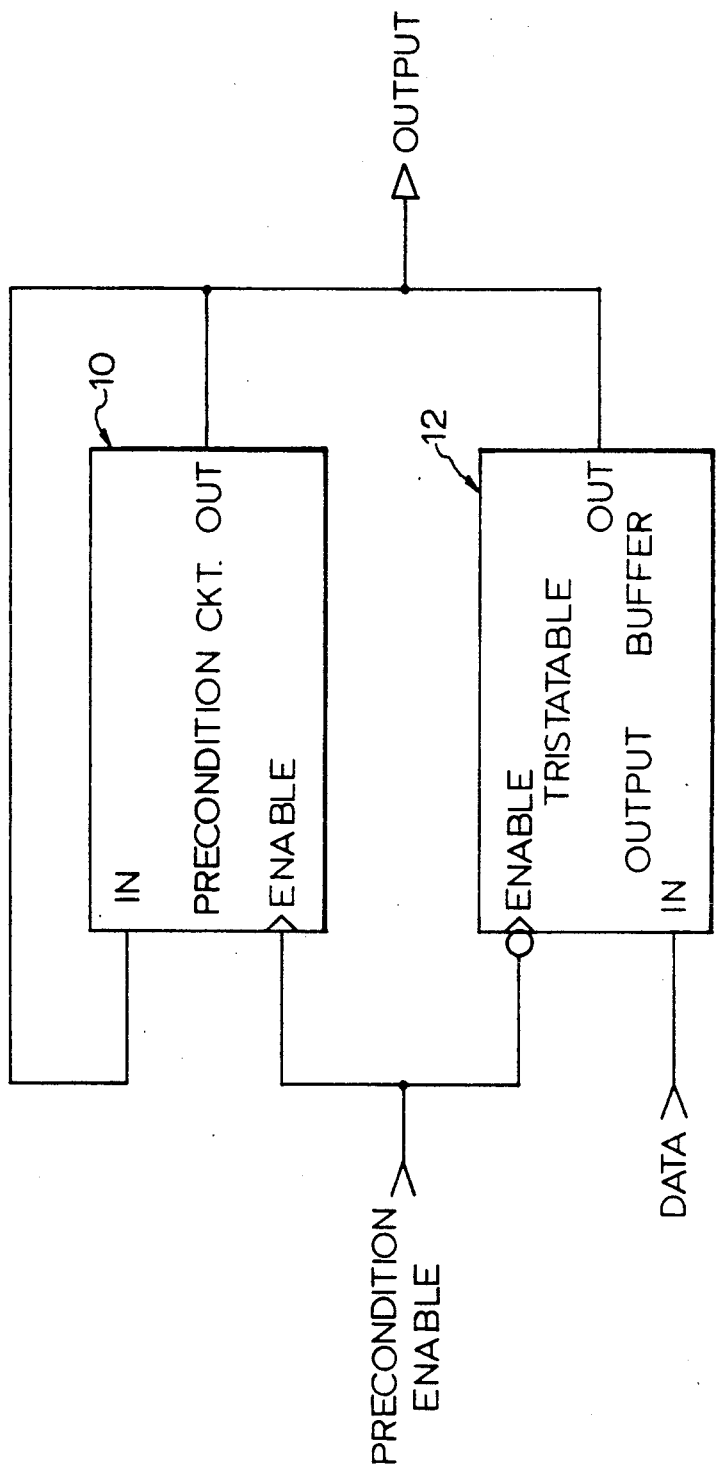
FIG. 1 is a block diagram showing the connection of the preconditioning circuit of the present invention connected to an output buffer.

FIG. 1 is a block diagram showing the connection of the preconditioning circuit 10 of the present invention to an output buffer 12. The output buffer 12 should be a tristate buffer having a high, a low and a high impedance state. The output of the preconditioning circuit 10 is connected to the output of the output buffer 12. The output of the preconditioning circuit is fed back to the input thereof. Complementary enable inputs are provided to the preconditioning circuit 10 and the output buffer 12. Output data is input to the output buffer in a conventional manner. As discussed more fully below, the preconditioning circuit 10 presets the output level of the output buffer 12 prior to the enabling of the output buffer 12. In the preferred embodiment, the preset voltage is chosen between the high and low level digital signals of the technology of implementation, i.e., transistor-transistor logic (TTL), emitter coupled logic (ECL), etc. The preconditioning circuit is automatically self-disabled when the desired output level is reached.

Figure 2:
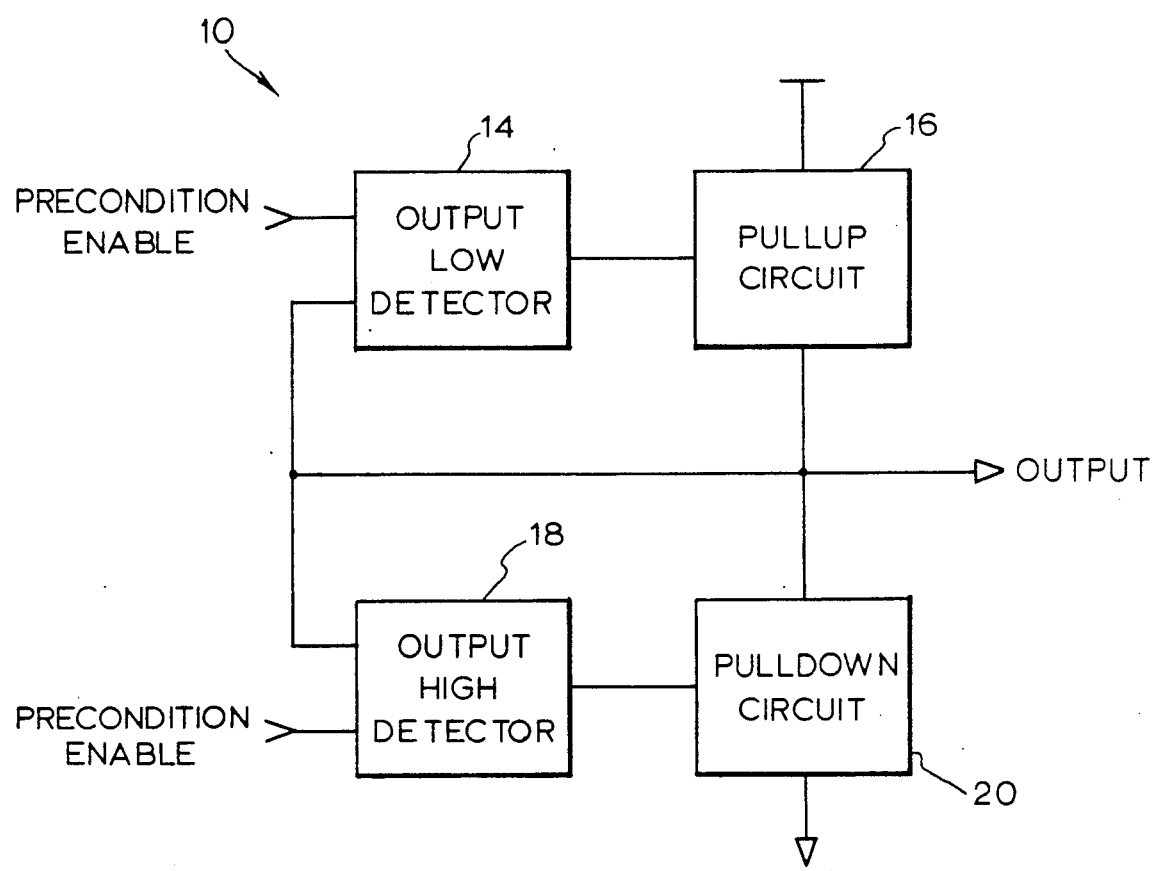
FIG. 2 is a block diagram of the preconditioning circuit of the present invention.

FIG. 2 is a block diagram of the preconditioning circuit 10 of the present invention. The preconditioning circuit 10 includes an output low detector 14, a pullup circuit 16, an output high detector 18 and a pulldown circuit 20. Each of these components is shown in greater detail in the schematic diagram of FIG. 3.

Figure 3:
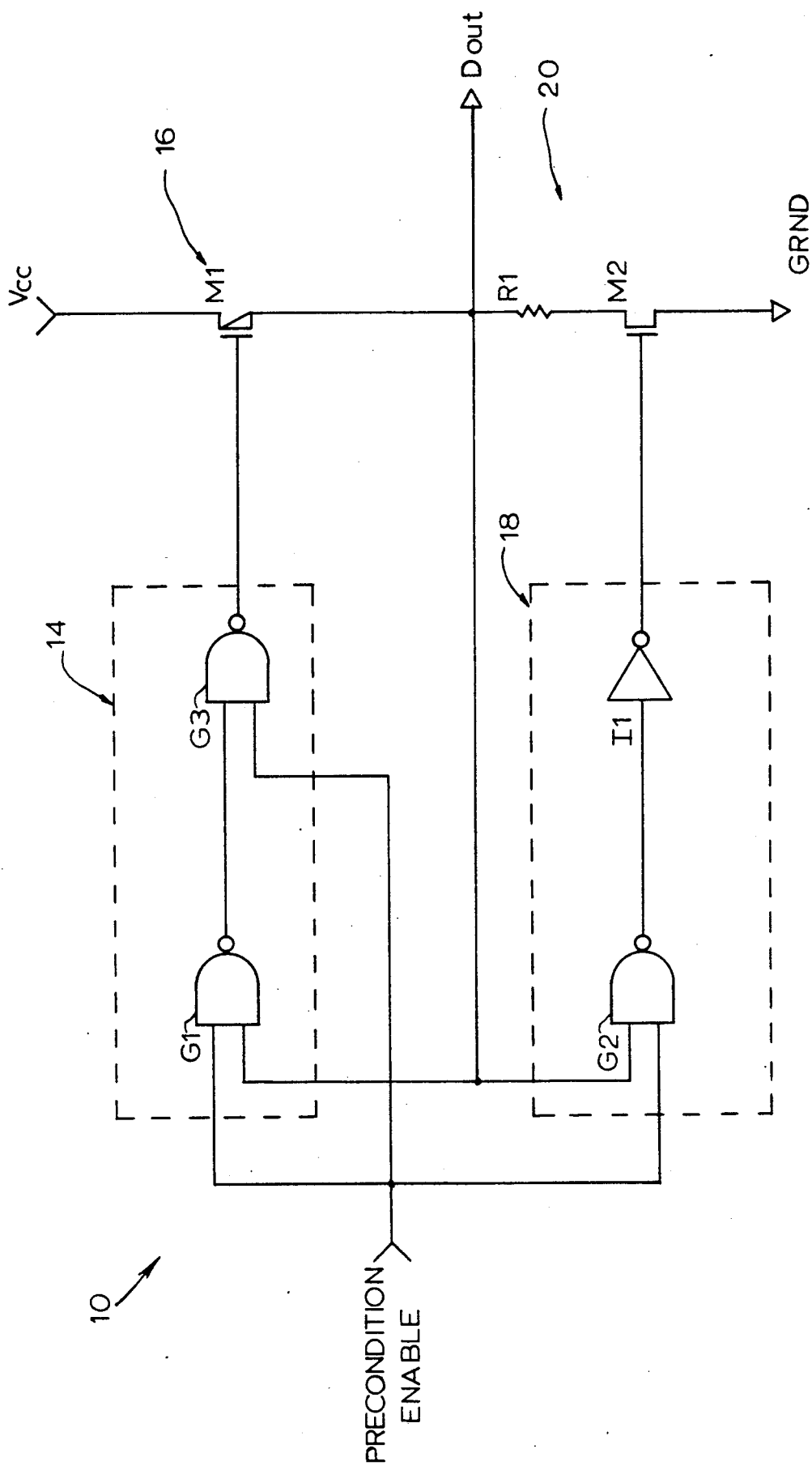
FIG. 3 is a schematic diagram of the preconditioning circuit of the present invention.

As shown in FIG. 3, in the preferred embodiment, the output low detector 14 is implemented with cascaded NAND gates G1 and G3. A first input of the first NAND gate G1 is connected to a source (not shown) of an enable signal for the preconditioning circuit 10. This signal may be provided by any clock signal which is timed to precede the enable signal for the output buffer 12. A second input of the first NAND gate G1 is connected to the output buffer output terminal. The output of the first NAND gate G1 is a first input to the second NAND gate G3. The second input of the second NAND gate is connected to the source of the preconditioning enable signal. The output of the second NAND gate G3 is connected to the gate of a p-channel transistor M1.

The p-channel transistor M1 is the preferred implementation of the pullup circuit 16. The source of the pullup transistor M1 is connected to a source of voltage supply $V_{cc}$. The drain of the pullup transistor M1 is connected to the outputs of the preconditioning circuit 10 and the output buffer 12.

The output high detector 18 is implemented with a third NAND gate G2 and an inverter I1. The first input of the third NAND gate G2 is connected to the source of the enable signal for the preconditioning circuit 10. The second input of the third NAND gate G2 is connected to the output buffer output terminal. The output of the third NAND gate G2 is connected to input of the inverter I1. The output of the inverter I1 is connected to the gate of an n-channel transistor M2.

The n-channel transistor M2 is connected to the outputs of the preconditioning circuit 10 and the output buffer 12 through a resistor R1. The n-channel transistor M2 and the resistor R1 constitute the preferred implementation of the pulldown circuit 20. The drain of the pulldown transistor M2 through resistor R1 is connected to the output of the preconditioning circuit 10 and the output buffer 12. The source of the pulldown transistor M2 is connected to a source of ground potential.

The areas of the P type material to N type material of the transistors at the second inputs of the first and third gates G1 and G2, that is, those transistors connected to the output of the device 10, should be chosen: 1) such that the P/N ratio of the input transistor at the first gate G1 is less the P/N ratio of the input transistor at the third gate G2 to prevent oscillation and 2) to set the trip points or detection thresholds of the input transistors of the first and third gates G1 and G2 for symmetry about a desired set point for the preconditioning circuit 10. Table I below provides illustrative sizes for the components of the circuit of FIG. 3. All dimensions are in microns unless otherwise indicated.

TABLE I

| component | length | width |
| --- | --- | --- |
| G1 (first input) p-channel | 10 | 1.2 |
| G1 (first input) n-channel | 20 | 1.2 |
| G1 (second input) p-channel | 4 | 1.4 |
| G1 (second input) n-channel | 30 | 1.4 |
| G2 (first input) p-channel | 15 | 1.2 |
| G2 (first input) n-channel | 10 | 1.2 |
| G2 (second input) p-channel | 50 | 1.4 |
| G2 (second input) n-channel | 10 | 1.4 |
| G3 (first input) p-channel | 15 | 1.2 |
| G3 (first input) n-channel | 10 | 1.2 |
| G3 (second input) p-channel | 15 | 1.2 |
| G3 (second input) n-channel | 10 | 1.2 |
| I1 p-channel | 10 | 1.2 |
| I1 n-channel | 30 | 1.2 |
| M1 | 40 | 1.6 |
| M2 | 40 | 1.6 |

Using such ratios, a set point for the preconditioning circuit 10 may be chosen between the high and low digital voltage levels of the technology of implementation.

Figure 4:
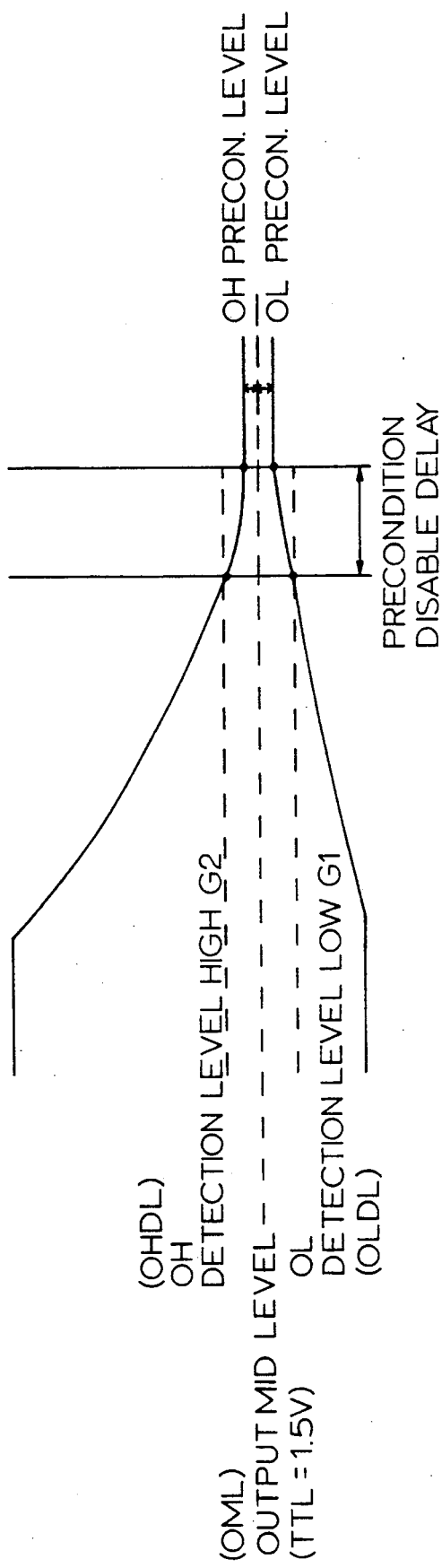
FIG. 4 is a graph of the output voltage of an output buffer equipped with the preconditioning circuit of the present invention.

In operation, on receipt of the enable signal, the NAND gates G1, G2 and G3 become inverters. If the output of the buffer 12 is above the set point, the inputs to the output low detector 14 and the output high detector 18 at NAND gates G1 and G2 are both high. A high in excess of the detection threshold of the first NAND gate G1, places a low at the input of the second NAND gate G3 which, in turn, places a high at the gate of the pullup transistor M1. As the pullup transistor M1 is a p-channel transistor, M1 is off. Similarly, the high in excess of the detection threshold at the input of the third NAND gate G2 results in a high at the gate of the pulldown transistor M2. Thus, the output of the preconditioning circuit 10 and the output buffer 12 is pulled down and held at output high detection level (OHDL). See FIG. 4.

Similarly, if the output of the buffer 12 is lower than the set point, the inputs to the output low detector 14 and the output high detector 18 are both low. Thus, the pullup transistor M1 is on and the pulldown transistor M2 is off. Thus, the output of the preconditioning circuit 10 and the output buffer 12 is pulled up and held at output low detection level (OLDL). See FIG. 4.

In accordance with the present teachings, if the output of the buffer 12 is at the set point, the trip points of the output low and output high level detectors 14 and 18 are not exceeded. Thus, the pullup and pulldown transistors, M1 and M2 respectively, are off and the output levels are unaffected. Similarly, if the precondition enable signal is not present, the outputs of the three NAND gates are driven high resulting in a high at the input of the pullup transistor M1 and a low at the input of the pulldown transistor M2. Thus, once again, the pullup and pulldown transistors M1 and M2 are off.

Thus, the present invention has been described herein with reference to a particular embodiment for a particular application. Those having ordinary skill in the art and access to the present teachings will recognize additional modifications, applications, and embodiments within the scope thereof. For example, the invention is not limited to implementation in either positive or negative logic. Nor is the invention limited to the use of field effect transistors. Any suitable switching element may be used in place of the transistors in the illustrative embodiments without departing from the scope of the present teachings.

It is therefore intended by the appended claims to cover any and all such applications, modifications and embodiments within the scope of the present invention.

Accordingly,

What is claimed is:

1. A preconditioning circuit for use with a buffer comprising:

means for detecting an output level of said buffer, including an output low level detector and an output high level detector, said output low level detector including first logic circuit means for receiving an enable signal and providing a first intermediate output signal in response to said enable signal and the output level of said buffer, and said output high level detector including second logic circuit means for receiving said enable signal and providing a second intermediate output signal in response to said enable signal and the output level of said buffer;

pullup means for increasing the output level of said buffer when said detected output level is below a predetermined low detection level; and pulldown means for decreasing the output level of said buffer when said detected output level is above a predetermined high detection level.

2. The invention of claim 1 wherein said first logic circuit means includes first and second NAND gates coupled in a cascaded configuration with the output of said first NAND gate being a first input to said second NAND gate.

3. The invention of claim 2 wherein a first input of said first NAND gate is connected to a source of said enable signal.

4. The invention of claim 3 wherein a second input of said first NAND gate is connected to the output of said buffer.

5. The invention of claim 4 wherein the first NAND gate is implemented with n-type and p-type semiconductive material and the ratio of the area of the p-type material to the area of the n-type material, of transistors, within said first NAND gate, connected to the output of said buffer, is chosen to set a low level detection threshold below which said preconditioning circuit is activated.

6. The invention of claim 4 wherein a second input of said second NAND gate is connected to said source of said enable signal.

7. The invention of claim 6 wherein the output of said second NAND gate is connected to the input of said pullup means.

8. The invention of claim 7 wherein said pullup means is a p-type transistor having a first terminal connected to a source of voltage supply and a second terminal connected to the output of said buffer.

9. The invention of claim 2 wherein said second logic means includes a third NAND gate and an inverter arranged in a cascaded configuration with the output of said third NAND gate being input to the inverter.

10. The invention of claim 9 wherein a first input of said third NAND gate is connected to said enable signal for said preconditioning circuit.

11. The invention of claim 10 wherein a second input of said third NAND gate is connected to the output of said buffer.

12. The invention of claim 11 wherein the third NAND gate is implemented with n-type and p-type semiconductive material and the ratio of the area of the p-type material to the area of the n-type material, of transistors, within said third NAND gate, connected to the output of said buffer, is chosen to set said high level detection threshold level above which said preconditioning circuit is activated.

13. The invention of claim 10 wherein the output of said inverter is connected to the input of pulldown means for reducing the output level of said buffer.

14. The invention of claim 13 wherein said pulldown means is an n-type transistor having a first terminal connected to the output of said buffer and a second terminal connected to a source of a second potential.

15. An improved output buffer comprising:
means for detecting the output level of said buffer, said buffer having a preconditioning circuit, including an output low level detector and an output high level detector, said output low level detector including first and second NAND gates coupled in a cascaded configuration with the output of said first NAND gate being a first input to said second NAND gate, a first input of said first NAND gate being connected to a source of an enable signal for said preconditioning circuit, a second input of said first NAND gate being connected to the output of said buffer, and a second input of said second NAND gate being connected to said source of an enable signal for said preconditioning circuit and said output high level detector including a third NAND gate and an inverter coupled in a cascaded configuration with the output of said third NAND gate being input to said inverter, a first input of said third NAND gate being connected to said source of an enable signal for said preconditioning circuit and a second input of said third NAND gate being connected to the output of said buffer;

pullup means for increasing the output level of said buffer when the output thereof is below a predetermined low level, the output of said second NAND gate is connected to the input of said pullup means; and pulldown means for decreasing the output level of said buffer when the output thereof is above a predetermined high level, the output of said inverter being connected to the input of said pulldown means.

16. The invention of claim 15 wherein the first NAND gate is implemented with n-type and p-type semiconductive material and the ratio of the area of the p-type material to the area of the n-type material, of transistors, within said first NAND gate, connected to the output of said buffer, is chosen to set said low level below which said preconditioning circuit pullup means is activated.

17. The invention of claim 15 wherein the third NAND gate is implemented with n-type and p-type semiconductive material and the ratio of the area of the p-type material to the area of the n-type material, of transistors, within said third NAND gate, connected to the output of said buffer, is chosen to set said high level above which said preconditioning circuit is activated.

18. The invention of claim 15 wherein said pullup means is a p-type transistor having a first terminal connected to a source of voltage supply and a second terminal connected to the output of said buffer.

19. The invention of claim 15 wherein said pulldown means is an n-type transistor having a first terminal connected to the output of said buffer and a second terminal connected to a source of a second potential.

* * * * *